United States Patent
Bhatia et al.

(10) Patent No.: US 10,204,668 B1
(45) Date of Patent: Feb. 12, 2019

(54) ON DIE DELAY RANGE CALIBRATION

(71) Applicant: SanDisk Technologies LLC, Plano, TX (US)

(72) Inventors: Sneha Bhatia, Gurgaon (IN); Amandeep Kaur, Bangalore (IN); Ravindra Arjun Madpur, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/727,987

(22) Filed: Oct. 9, 2017

(51) Int. Cl.
 G11C 8/00 (2006.01)
 G11C 7/22 (2006.01)
 G11C 7/08 (2006.01)

(52) U.S. Cl.
 CPC ............... *G11C 7/222* (2013.01); *G11C 7/08* (2013.01)

(58) Field of Classification Search
 CPC .................................. G11C 7/222; G11C 7/08
 See application file for complete search history.

(56) References Cited

U.S. PATENT DOCUMENTS

| | | | |
|---|---|---|---|
| 4,797,575 A | 1/1989 | Lofgren | |
| 4,922,141 A | 5/1990 | Lofgren et al. | |
| 7,157,948 B2 * | 1/2007 | McClannahan | G11C 7/1066 327/151 |
| 7,227,795 B2 * | 6/2007 | Lee | G11C 7/1051 327/155 |
| 7,606,089 B2 * | 10/2009 | Joo | G11C 7/1066 365/189.12 |
| 7,872,494 B2 * | 1/2011 | Welker | H03K 5/1565 326/30 |
| 8,379,457 B1 | 2/2013 | Chen | |
| 8,766,695 B1 | 7/2014 | Bhuiyan | |
| 8,767,471 B2 | 7/2014 | Chen | |
| 9,148,157 B2 | 9/2015 | Odedara et al. | |
| 9,660,656 B2 | 5/2017 | Subramanian et al. | |
| 9,673,798 B1 | 6/2017 | Tang et al. | |
| 2013/0064025 A1 * | 3/2013 | Chen | G06F 13/1689 365/193 |
| 2013/0194873 A1 | 8/2013 | Chen | |
| 2014/0184297 A1 | 7/2014 | Bhuiyan | |
| 2016/0308540 A1 | 10/2016 | Subramanian et al. | |

FOREIGN PATENT DOCUMENTS

CN 104871247 A 8/2015

\* cited by examiner

*Primary Examiner* — Pho M Luu
(74) *Attorney, Agent, or Firm* — Foley & Lardner LLP

(57) ABSTRACT

Disclosed is a system including a memory timing calibration circuit to calibrate a strobe signal of a memory device and a method of calibrating the strobe signal. The memory timing calibration circuit includes a difference signal generator coupled to a strobe signal generator and an external control circuit. The difference signal generator is configured to generate a difference signal indicating a time difference between the strobe signal from the strobe signal generator and an external clock signal from the external control circuit. The memory timing calibration circuit further includes a delay circuit coupled to the difference signal generator and the external control circuit. The delay circuit is configured to generate a modified external clock signal by delaying the external clock signal by a delay determined based at least in part on the difference signal.

22 Claims, 6 Drawing Sheets

ON DIE DELAY RANGE CALIBRATION

BACKGROUND

The following description is provided to assist the understanding of the reader. None of the information provided or references cited is admitted to be prior art.

A memory device stores content data and outputs the stored content data when requested. In one implementation, an external controller provides an external clock signal (e.g., read enable (RE) clock signal) to the memory device for data read operations. In return, the memory device outputs, to the controller, output data including the stored content data along with a DQS strobe signal generated based on the RE clock signal. The time after which a DQS strobe signal (also referred to herein as a "DQS strobe") is generated once an edge (e.g., rising edge) of a valid RE clock signal (e.g., rising edge of RE Clock signal) is received is referred to as a data access time tDQSRE. The data access time within a data access time tDQSRE range (also referred to as "a data access time range" or "tDQSRE range" herein) enables a successful memory read operation.

In one approach, the data access time tDQSRE is calibrated by comparing the RE clock signal and the DQS strobe, and sequentially modifying the DQS strobe. For example, the DQS strobe may be modified to be synchronous to a modified RE clock signal generated by adding delay to the RE clock signal. The delay may be sequentially increased for multiple cycles of the RE clock signal until the data access time tDQSRE is within the data access time tDQSRE range. However, sequentially calibrating the DQS strobe for multiple RE clock cycles may take a while, and accordingly the data throughput may be decreased due to the extended calibration.

SUMMARY

Various embodiments disclosed herein are related to a circuit to calibrate a strobe signal of a memory device. The circuit includes a difference signal generator coupled to a strobe signal generator and an external control circuit. The difference signal generator is configured to generate a difference signal indicating a time difference between a strobe signal from the strobe signal generator and an external clock signal from the external control circuit. The circuit further includes a delay circuit coupled to the difference signal generator and the external control circuit. The delay circuit is configured to obtain a modified external clock signal by delaying the external clock signal by a delay determined based at least in part on the difference signal.

In one or more embodiments, the difference signal generator includes a flip flop comprising a clock input port coupled to the strobe signal generator, and a reset port coupled to the external control circuit. The flip flop may be configured to generate the difference signal having a pulse width corresponding to the time difference between a rising edge of the strobe signal and a rising edge of an inverted external clock signal having an inverted phase to the external clock signal.

The circuit may further include a delay control circuit coupled between the flip flop and the delay circuit. The delay control circuit may be configured to determine the pulse width of the difference signal, and generate a delay control signal according to the pulse width. The delay circuit may be configured to obtain the modified external clock signal by delaying the external clock signal according to the delay control signal.

The delay control circuit may include a chain of AND gates and a set of flip flops. Each AND gate of the chain of AND gates may be coupled to a corresponding flip flop of the set of flip flops. An AND gate of the chain of AND gates may include a first input coupled to an output of a preceding AND gate of the chain of AND gates and a second input coupled to a delayed output of the preceding AND gate delayed by a unit delay. The AND gate may also include an output coupled to a clock input of a corresponding flip flop of the set of flip flops and an input of a succeeding AND gate of the chain of AND gates.

In one or more embodiments, the strobe signal is a DQS strobe and the external clock signal is an RE signal.

In one or more embodiments, the strobe signal generator is configured to modify the strobe signal to be synchronous to the modified external clock signal. A transmission circuit coupled to the circuit may be configured to generate an output signal indicating content data stored by memory cells according to the modified strobe signal.

Various embodiments disclosed herein are related to a memory device. The memory device includes memory cells configured to store content data. The memory device further includes a strobe signal generator configured to generate a strobe signal. The memory device further includes a memory timing calibration circuit. The memory timing calibration circuit includes a difference signal generator coupled to the strobe signal generator and an external control circuit. The difference signal generator is configured to receive the strobe signal from the strobe signal generator and an external clock signal from the external control circuit. The difference signal generator is further configured to generate a difference signal indicating a time difference between the strobe signal and the external clock signal. The memory timing calibration circuit further includes a delay circuit coupled to the difference signal generator and the external control circuit. The delay circuit is configured to generate a modified external clock signal by delaying the external clock signal based at least in part on the difference signal. The memory device further includes a transmission circuit coupled to the memory timing calibration circuit. The transmission circuit is configured to generate an output signal indicating the content data stored by the memory cells according to the modified external clock signal.

Various embodiments disclosed herein are related to a method of calibrating a strobe signal of a memory device. The method includes receiving an external clock signal from an external control circuit. The method further includes determining a time difference between the external clock signal and the strobe signal. The method further includes obtaining a modified external clock signal by delaying the external clock signal by a delay determined based at least in part on the time difference. The method further includes generating a modified strobe signal according to the modified external clock signal.

In one or more embodiments, the method further includes detecting an edge of the strobe signal and an edge of the external clock signal. The method further includes generating a difference signal having a pulse between the edge of the strobe signal and the edge of the external clock signal. The pulse may indicate the time difference between the external clock signal and the strobe signal.

In one or more embodiments, the method further includes converting the time difference indicated by the difference signal into a corresponding digital representation. The delay may be added to the external clock signal according to the digital representation.

The time difference may be converted into the digital representation by determining whether a first pulse width of the difference signal is larger than a unit delay, generating a unit pulse detection signal having a second pulse width less than the first pulse width by the unit delay, and generating a first bit of the digital representation indicating that the first pulse width of the difference signal is at least the unit delay. In addition, the time difference may be converted into the digital representation by determining whether the second pulse width of the unit pulse detection signal is larger than the unit delay, generating another unit pulse detection signal having a third pulse width less than the second pulse width by the unit delay, and generating a second bit of the digital representation indicating that the second pulse width of the unit pulse detection signal is at least the unit delay.

The foregoing summary is illustrative and is not intended to be in any way limiting. In addition to the illustrative aspects, embodiments, and features described above, further aspects, embodiments, and features will become apparent by reference to the following drawings and the detailed description.

Figure 1:
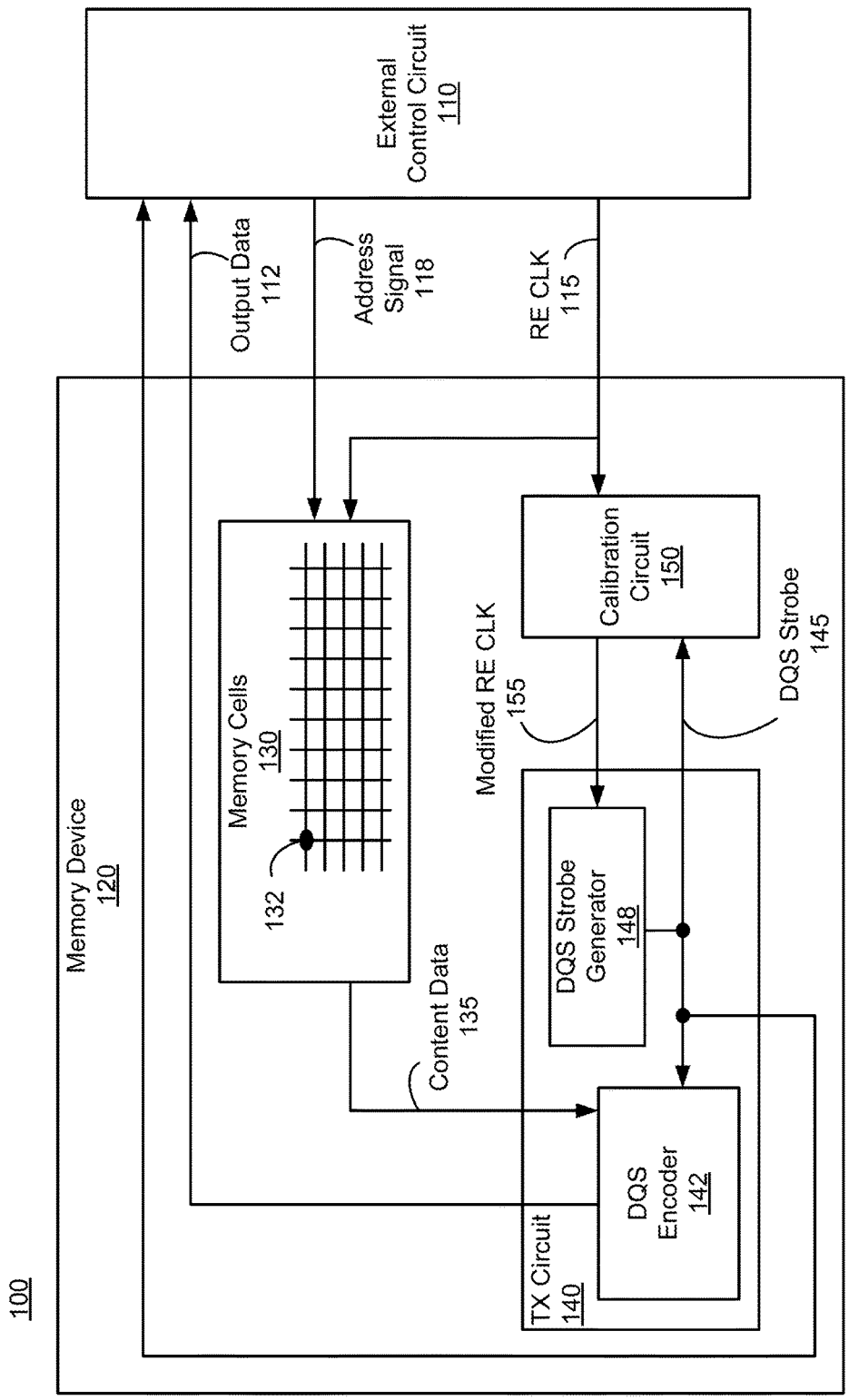
FIG. 1 is a schematic diagram of a memory system in accordance with an illustrative embodiment.

The foregoing and other features of the present disclosure will become apparent from the following description and appended claims, taken in conjunction with the accompanying drawings. Understanding that these drawings depict several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed is a calibration circuit of a memory device that determines a time difference between a strobe signal and an external clock signal, and modifies the strobe signal according to the determined time difference. In some embodiments, the memory device includes a difference signal generator (e.g., a flip flop, a latch, pulsed latch, AND gate, OR gate, NAND gate, NOR gate, XOR gate, XNOR gate, or any combination of them) coupled to a strobe signal generator and an external control circuit. The difference signal generator is configured to generate a difference signal indicating a time difference between an edge (e.g., a rising edge) of the strobe signal from the strobe signal generator and an edge (e.g., a falling edge) of the external clock signal from the external control circuit. In one aspect, the edge of the external clock signal occurs prior to a subsequent edge of the strobe signal. The memory device further includes a delay circuit coupled to the difference signal generator and the external control circuit. The delay circuit is configured to generate a modified external clock signal by delaying the external clock signal by a delay determined based at least in part on the difference signal. In one aspect, the strobe signal may be modified to be synchronous to the modified external clock signal, and the modified strobe signal may be applied for generating an output signal indicating content data stored by memory cells.

Advantageously, the calibration circuit allows on die delay calibration of the strobe signal for performing memory read operation in a time efficient manner. Specifically, the calibration circuit determines the time difference between the strobe signal and the external clock signal, and adaptively modifies the strobe signal according to the determined time difference. Hence, calibration of the strobe signal may be completed before a next pulse of the external clock signal arrives. Accordingly, calibration performed by the disclosed calibration circuit can be performed faster than sequentially adjusting a delay added to the external clock signal for multiple clock cycles.

Example Memory System with Calibration Device

Referring to FIG. 1, illustrated is a schematic diagram of a memory system 100, in accordance with an illustrative embodiment. The memory system 100 includes an external control circuit 110 (also referred to as "external controller 110") and a memory device 120. The external control circuit 110 and the memory device 120 may be coupled to each other through a data bus or any communication link. The external control circuit 110 may provide an address signal 118 and a read enable clock 115 (also referred to as "RE clock," "RE CLK 115," or an "external clock signal") to the memory device 120. In return, the memory device 120 may transmit output data 112 indicating content corresponding to the address signal 118 according to the RE CLK 115. The memory device 120 may output the DQS strobe 145 along with the output data 112. In some embodiments, the memory device 120 embeds the DQS strobe 145 to the output data 112, and outputs the output data 112 embedded with the DQS strobe to the external control circuit 110. In other embodiments, the memory system 100 includes more, fewer, or different components than shown in FIG. 1.

In one approach, the external control circuit 110 issues a calibration command to instruct the memory device 120 to initiate a calibration operation. The external control circuit 110 provides the RE CLK 115 to the memory device 120. In response to the calibration command, the memory device 120 may perform calibration operation to adjust the DQS strobe 145 according to the RE CLK 115. After the calibration is performed, the memory device 120 may transmit a calibration confirmation message indicating that the calibration is completed to the external control circuit 110. In response to the calibration confirmation message, the external control circuit 110 transmits a data read command to the memory device 120 with an address signal indicating an address of a target memory cell. In response to the data read command and the address signal, the memory device 120 outputs a value stored by the target memory cell in the memory device 120 to the external control circuit 110, based on the DQS strobe. In one aspect, the memory device 120 may encode the value stored by the target memory cell according to the DQS strobe for transmission to the external control circuit 110. The memory device 120 may also transmit the DQS strobe to the external control circuit 110 along with the output value stored by the target memory cell.

The external control circuit 110 is a processing circuit that executes instructions to write data to or read data from the memory device 120. The external control circuit 110 may receive an instruction from a user through an I/O interface (not shown) or another processing circuit. For writing data, the external control circuit 110 may transmit a write instruction specifying data to be stored and address associated with the data to be stored. For reading data, the external control circuit 110 may transmit, to the memory device 120, a read instruction comprising the RE CLK 115 indicating timing information for performing read operation and the address signal 118 indicating a target address of content to be retrieved. In response to the address signal 118 and the RE CLK 115 transmitted to the memory device 120, the external control circuit 110 receives the output data 112 from the memory device 120.

The memory device 120 is a storage device that stores and retrieves data according to an instruction from the external control circuit 110. In some embodiments, the memory device 120 includes memory cells 130, a transmission circuit 140 (also referred to as a "TX circuit 140" herein), and a calibration circuit 150. These components operate together to perform data read operations by generating the output data 112 indicative of stored data associated with the address signal 118. The output data 112 is generated according to timing information specified by the RE CLK 115. The memory device 120 and the external control circuit 110 may be implemented on separate dies, or implemented on a same die.

The memory cells 130 are hardware components that store content data. The memory cells 130 may include an array of cells 132, where each cell 132 may be configured to store a corresponding bit of content data. Each cell is associated with a corresponding address identified by the address signal 118. The memory cells 130 may receive the address signal 118 and the RE CLK 115, and output content data 135 of one or more cells 132 identified by the address signal 118. The output content data 135 may be synchronous to the RE CLK 115. The memory cells 130 may be non-volatile memory cells, which may include but are not limited to: ReRAM, Memristor memory, programmable metallization cell memory, phase-change memory (PCM, PCME, PRAM, PCRAM, ovonic unified memory, chalcogenide RAM, or C-RAM), NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

The TX circuit 140 is a component that receives the content data 135 from the memory cells 130, and generates output data 112 indicating the retrieved content data. In one implementation, the TX circuit 140 is coupled to the memory cells 130 and the calibration circuit 150. The TX circuit 140 may include a DQS encoder 142 and a DQS strobe generator 148. In one implementation, the DQS strobe generator 148 is coupled between the calibration circuit 150 and the DQS encoder 142, where the DQS encoder 142 is coupled to the memory cells 130, the DQS strobe generator 148 and the calibration circuit 150. In this configuration, the DQS strobe generator 148 receives a modified RE CLK 155 from the calibration circuit 150 to generate a DQS strobe 145 including one or more pulses, and transmits the DQS strobe 145 to the DQS encoder 142. The DQS encoder 142 receives the content data 135 from the memory cells 130, and encodes the retrieved content data 135 according to the DQS strobe 145 to generate the output data 112.

In one aspect, successful encoding by the DQS encoder 142 depends on receiving the content data 135 and the DQS strobe 145 in a timely manner. For example, data access time tDQSRE between an edge (e.g., a rising edge) of the RE CLK 115 and an edge (e.g., a rising edge) of a pulse of the DQS strobe 145 within a predetermined range (e.g., 12.5 ns~20 ns) allows a successful encoding of the content data 135 to obtain the output data 112. In some aspect, a rising edge of the DQS strobe 145 after a falling edge of the RE CLK 115 is preferred. However, the DQS strobe 145 from the DQS strobe generator 148 without calibration may introduce unknown delays, such that the edge (e.g., rising edge) of the pulse of the DQS strobe 145 may be away from the edge (e.g., rising edge) of the RE CLK 115 beyond the predetermined range (e.g., tDQSRE range). For example, the data access time tDQSRE without calibration may be less than 12.5 ns. To adjust the data access time tDQSRE, the DQS strobe generator 148 may output the DQS strobe 145 to the calibration circuit 150, and receive the modified RE CLK 155 compensated for lack of the data access time tDQSRE. According to the modified RE CLK 115, the DQS strobe generator 148 can generate a modified DQS strobe 145 having an edge (e.g., a rising edge) of a pulse within the predetermined range (e.g., tDQSRE range) away from an edge (e.g., a rising edge) of the RE CLK 155. In one aspect, means for generating the modified DQS strobe 145 according to the modified RE CLK 155 includes the DQS strobe generator 148.

The calibration circuit 150 is a component that receives the DQS strobe 145 and the RE CLK 115, and generates the modified RE CLK 155. In one implementation, the calibration circuit 150 is coupled between the external control circuit 110 and the TX circuit 140. The calibration circuit 150 may compare the DQS strobe 145 and the RE CLK 115 to determine a time difference between the DQS strobe 145 and the RE CLK 115, and generate the modified RE CLK 155 by delaying the RE CLK 115 according to the time difference. Detailed implementation and operation of the calibration circuit 150 are provided below with respect to FIGS. 2 through 6.

In some embodiments, the memory system 100 includes multiple memory devices 120, where each memory device is fabricated on a corresponding semiconductor die. One or more components of the memory device 120 may be also implemented on different dies. Behaviors of circuit components in different dies may vary depending on a process, voltage, temperature variations. Hence, timing of content data 135 and DQS strobe 145 received by the DQS encoder 142 may vary for different dies. Consequently, data access time tDQSRE may vary for different dies. Beneficially, the disclosed calibration circuit 150 allows data access time tDQSRE to be adaptively controlled for components in different dies in a time efficient manner by measuring a time difference between the DQS strobe 145 and the RE CLK 115 and modifying the DQS strobe 145 according to the time difference and independent of frequency of the RE CLK 115 and the DQS strobe 145. Specifically, a first memory device and a second memory device on separate dies may be coupled to an external control circuit 110. A first DQS strobe of the first memory device may be delayed by a first delay amount and a second DQS strobe of the second memory device may be delayed by a second delay amount, such that outputs from the first memory device and the second memory device can be synchronized to the RE CLK 115 from the external control circuit 110. In one aspect, the external control circuit 110 retrieves data from a first memory device on a slow die and subsequently retrieves data from a second memory device on a fast die. Without delay calibration, data output from the first memory device and data output from the second memory device may overlap with each other. By implementing the calibration circuit 150, delay can be dynamically configured to ensure that data output from the first memory device and data output from the second memory device do not overlap.

Figure 2:
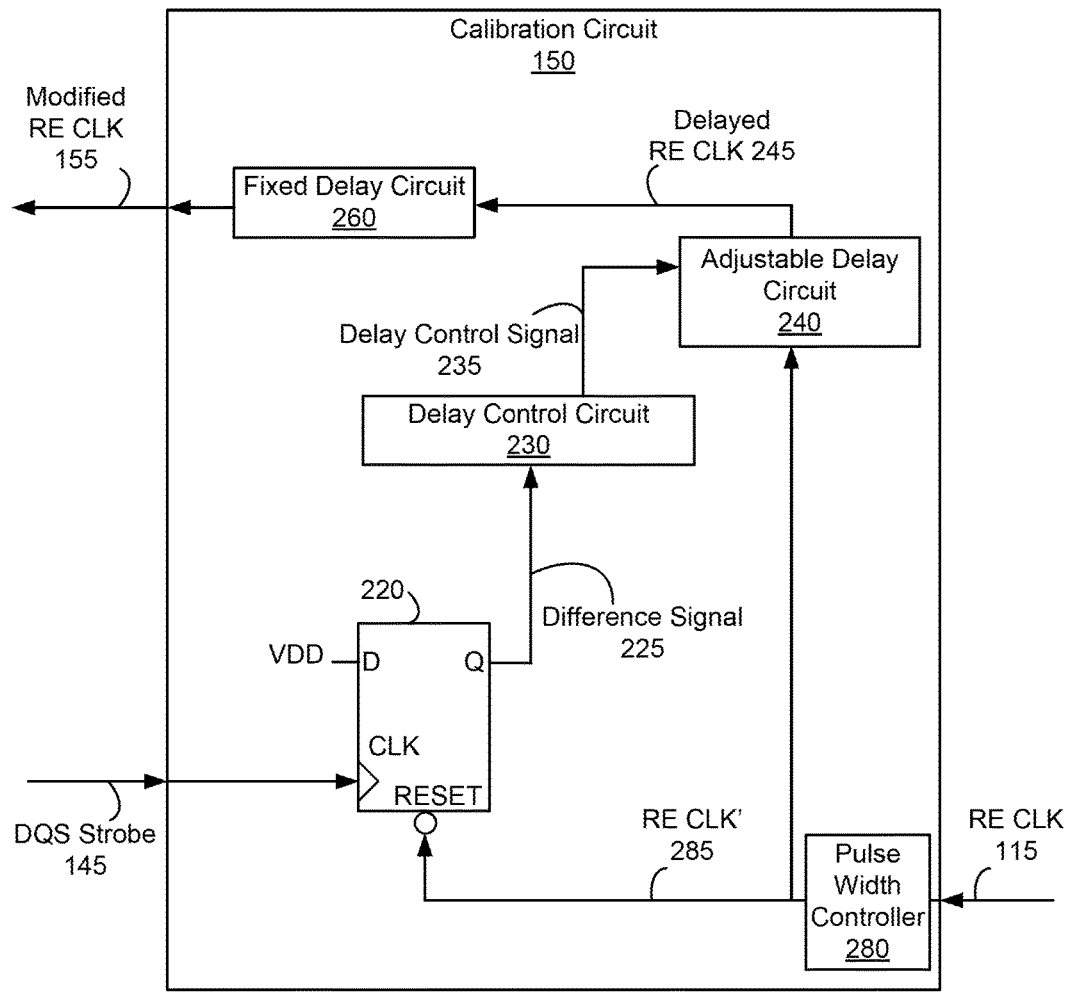
FIG. 2 is a detailed schematic diagram of a calibration circuit in accordance with an illustrative embodiment.

Referring to FIG. 2, illustrated is a detailed schematic diagram of a calibration circuit 150, in accordance with an illustrative embodiment. In one embodiment, the calibration circuit 150 includes a difference signal generator 220, a delay control circuit 230, an adjustable delay circuit 240, a pulse width controller 280, and a fixed delay circuit 260. These components operate together to receive the RE CLK 115 and the DQS strobe 145, and generate the modified RE CLK 155 according to a difference between an edge (e.g., rising edge) of a pulse in the DQS strobe 145 and an edge (e.g., falling edge) of the RE CLK 115. In other embodiments, the calibration circuit 150 includes more, fewer, or different components than shown in FIG. 2.

The pulse width controller 280 is a circuit component that adjusts a duty cycle or pulse width of the RE CLK 115. In one implementation, the pulse width controller 280 is coupled between the adjustable delay circuit 240 and the external control circuit 110, and is coupled between the difference signal generator 220 and the external control circuit 110. In this configuration, the pulse width controller 280 receives the RE CLK 115, and if the duty cycle or pulse width of the RE CLK 115 is outside of a predetermined range, the pulse width controller 280 generates an adjusted RE CLK' 285 having a duty cycle or pulse width within the predetermined range. If the duty cycle or pulse width of the RE CLK 115 is within the predetermined range, the pulse width controller 280 may bypass adjusting the duty cycle or pulse width of the RE CLK 115 and provide the RE CLK 115 to the difference signal generator 220 and the adjustable delay circuit 240 directly. The pulse width controller 280 may allow the difference signal generator 220 to be implemented with circuitries (e.g., latch, pulsed latch, AND gate, OR gate, NAND gate, NOR gate, XOR gate, XNOR gate, or any combination of them), where such difference signal generator 220 operates based on the RE CLK 115 having a duty cycle or pulse width within the predetermined range. In some embodiments, the pulse width controller 280 may be bypassed or omitted, and the RE CLK 115 may be directly provided to the difference signal generator 220 and the adjustable delay circuit 240 instead.

In some embodiments, the difference signal generator 220 is a circuit that generates a difference signal 225 indicating a difference between the DQS strobe 145 and the RE CLK 115. In one aspect, means for receiving the RE CLK 115 and determining a time difference between the DQS strobe 145 and the RE CLK 115 includes the difference signal generator 220. The difference signal generator 220 may be a DQ flip flop including a D input port coupled to a supply terminal VDD, a clock input port coupled to an output of the DQS strobe generator 148 to receive the DQS strobe 145, a reset bar port coupled to an output of the external control circuit 110 to receive the RE CLK 115 (or coupled to an output of the pulse width controller 280 to receive the adjusted RE CLK' 285), and a Q output port coupled to an input of the delay control circuit 230. In this configuration, the difference signal generator 220 generates the difference signal 225 having HIGH state (or value '1') once detecting a rising edge of the DQS strobe 145, and maintains HIGH state of the difference signal 225 until receiving a rising edge of an inverted RE CLK having an inverse phase of the RE CLK 115 (or until receiving a falling edge of the RE CLK 115). The difference signal generator 220 may reset the difference signal 225, for example, to LOW state, in response to the RE CLK 115 having LOW state. Thus, the difference signal 225 may include a pulse corresponding to a time difference between the rising edge of the DQS strobe 145 and the following falling edge of the RE CLK 115. In other embodiments, the difference signal generator 220 may include a reset port instead of the reset bar port, and an inverter may be implemented between the reset port of the difference signal generator 220 and the output of the external control circuit 110. Thus, the reset port may receive an inverted RE CLK having an inverted phase from the RE CLK 115. In some embodiments, the difference signal generator 220 may be implemented by a different circuit (e.g., AND gate, or any logic gate) other than the DQ flip flop. The difference signal generator 220 implemented with other combinatorial logic circuits may operate with the RE CLK 115 having a 50% duty cycle. Beneficially, the difference signal generator 220 implemented with the DQ flip flop may operate irrespective of the duty cycle of the RE CLK 115.

The delay control circuit 230 is a circuit that receives the difference signal 225 indicating the time difference between the DQS strobe 145 and the RE CLK 115, and generates a delay control signal 235 according to the time difference. The delay control circuit 230 may include an input coupled to the Q output port of the difference signal generator 220, and an output coupled to a control port of the adjustable delay circuit 240. In one aspect, the delay control circuit 230 is a time-to-digital conversion circuit that converts a pulse width of the difference signal 225 into a corresponding digital representation represented by the delay control signal 235. Detailed implementation and operation of the delay control circuit 230 are provided below with respect to FIGS. 4 through 6.

The adjustable delay circuit 240 and the fixed delay circuit 260 are circuits to add delays to the RE CLK 115 to obtain the modified RE CLK 155. In some embodiments, the fixed delay circuit 260 may be omitted or bypassed. In one aspect, means for obtaining the modified RE CLK 155 by delaying the RE CLK 115 by a delay determined based at least in part on the time difference between the DQS strobe 145 and the RE CLK 115 includes the adjustable delay circuit 240, the fixed delay circuit 260, or a combination of them. The adjustable delay circuit 240 may include an input coupled to the output of the external control circuit 110 to receive the RE CLK 115 (or the pulse width controller 280 to receive the adjusted RE CLK 285'), a control port coupled to the output of the delay control circuit 230 to receive the delay control signal 235, and an output coupled to an input of the fixed delay circuit 260. The adjustable delay circuit 240 may include multiple multiplexers, multiple delay cells, or any combination of them. The fixed delay circuit 260 includes an input coupled to the output of the adjustable delay circuit 240, and an output coupled to an input of the DQS strobe generator 148. In this configuration, the adjustable delay circuit 240 adds an adjustable delay to the RE CLK 115 to obtain the delayed RE CLK 245. An amount of delay added by the adjustable delay circuit 240 is determined according to the delay control signal 235. The fixed delay circuit 260 adds a fixed delay (or a constant delay) to the delayed RE CLK 245 to obtain the modified RE CLK 155. In one aspect, the delay added by the adjustable delay circuit 240 and the fixed delay circuit 260 represents the data access time tDQSRE of the RE CLK 115 and the DQS strobe 145. In some embodiments, the fixed delay circuit 260 may be omitted, and the adjustable delay circuit 240 may be directly connected to the DQS strobe generator 148. The modified RE CLK 115 allows the DQS strobe 145 to be adjusted such that data access time tDQSRE can be within the tDQSRE range.

Figure 3:
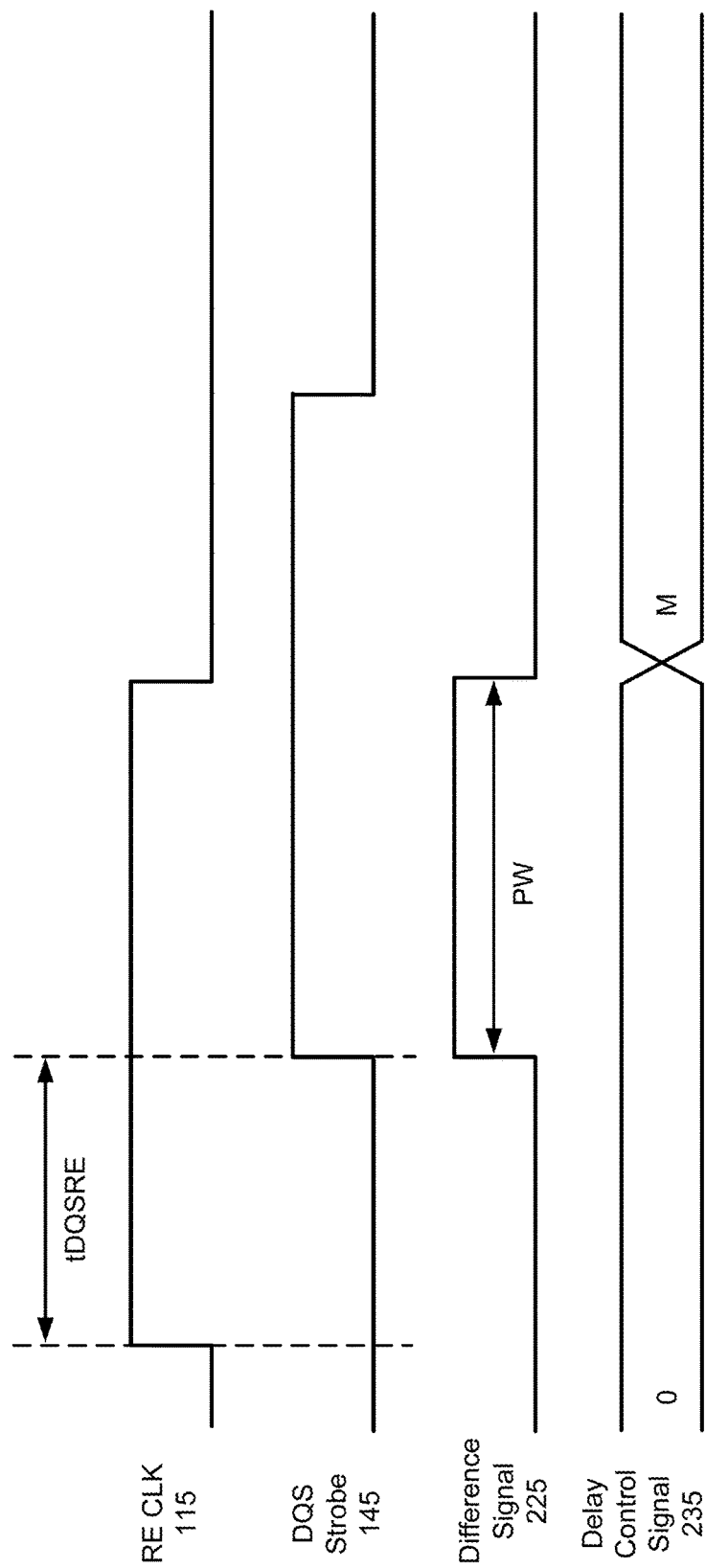
FIG. 3 is a timing diagram of signals of the calibration circuit of FIG. 2 in operation in accordance with an illustrative embodiment.

Referring to FIG. 3, illustrated is a timing diagram of signals of the calibration circuit of FIG. 2 in operation, in accordance with an illustrative embodiment. Specifically, FIG. 3 shows example timing diagrams of the RE CLK 115, DQS strobe 145, difference signal 225, and the delay control signal 235. In one aspect, a time difference between a rising edge of the RE CLK 115 and a rising edge of the DQS strobe 145 may represent a data access time tDQSRE. In response to a rising edge of the DQS strobe 145, the delay control circuit 230 generates the difference signal 225 to have HIGH state, and maintains HIGH state of the difference signal 225 until receiving a falling edge of the RE CLK 115 (or a rising edge of an inverted RE CLK). Thus, a pulse width PW of the difference signal 225 corresponds to a time difference between an edge (e.g., a rising edge) of the DQS strobe 145 and a following edge (e.g., a falling edge) of the RE CLK 115. The delay control circuit 230 also generates the delay control signal 235 digitally representing the pulse width PW of the difference signal 225. Generating a new DQS strobe 145 having a new tDQSRE by adding delay according to the pulse width PW as disclosed herein allows the new tDQSRE to be within the tDQSRE range.

Figure 4:
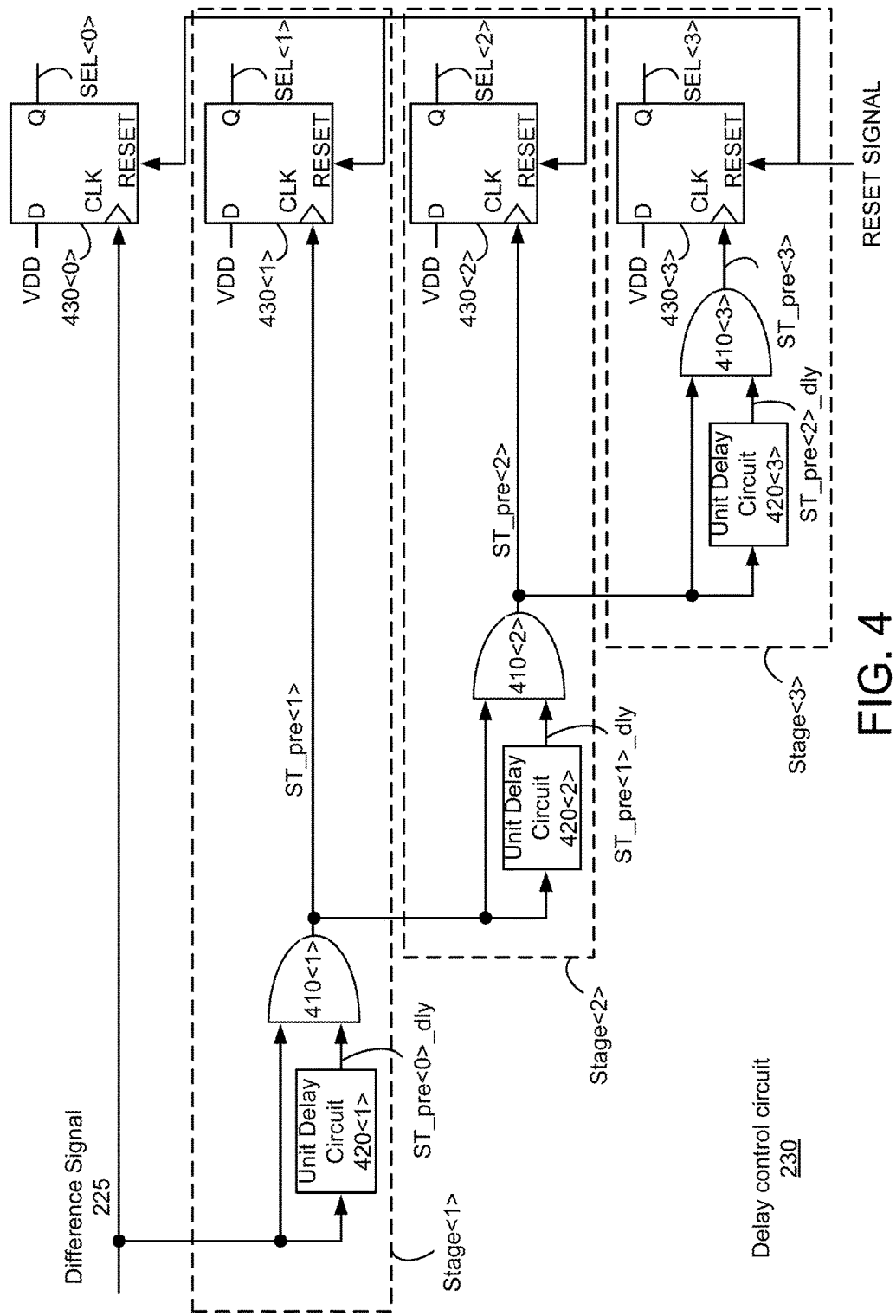
FIG. 4 is a schematic diagram of a delay control circuit of FIG. 2 in accordance with an illustrative embodiment.

Referring to FIG. 4, illustrated is a schematic diagram of the delay control circuit 230 of FIG. 2, in accordance with an illustrative embodiment. In some embodiments, the delay control circuit 230 includes a chain of AND gates 410<3:1>, unit delay circuits 420<3:1>, and flip flops 430<3:0>. These components operate together to convert a pulse width of the difference signal 225 into digital bits SEL<3:0> of the delay control signal 235. Although the delay control circuit 230 in FIG. 4 is shown to convert the pulse width of the difference signal 225 into four bits, the delay control circuit 230 may include additional or fewer AND gates 410, unit delay circuits 420, and flip flops 430 to represent the delay control signal 235 with different number of bits. In other embodiments, the delay control circuit 230 includes more, fewer, or different components than shown in FIG. 4.

The flip flop 430<0> generates the SEL<0> indicating whether the difference signal 225 has an edge (e.g., rising edge or falling edge). The flip flop 430<0> may be a DQ flip flop including a D input port coupled to a supply terminal VDD, a clock input port coupled to output of the difference signal generator 220 of FIG. 2 to receive the difference signal 225, a reset port coupled to an output of the external control circuit to receive a reset signal 575, and a Q output port coupled to the adjustable delay circuit 240 to output a digital bit SEL<0> indicating whether an edge (e.g., rising edge) of the difference signal 225 is detected. The reset signal 575 may be generated by the external control circuit 110 or generated within the memory device 120. The reset signal 575 may be generated when performing calibration, or when powering up the memory device 120. In this configuration, when the flip flop 430<0> receives a rising edge of the difference signal 225, the flip flop 430<0> may generate the bit SEL<0> to have HIGH state or value '1' and maintain HIGH state of the bit SEL<0> until a next rising edge of the reset signal 575. The flip flop 430<0> may reset the bit SEL<0>, for example, to LOW state or value '0', in response to a rising edge of the reset signal 575.

In one aspect, other components of the delay control circuit 230 are divided into a plurality of stages<3:1>, where each stage<n> includes a corresponding AND gate 410<n>, unit delay circuit 420<n>, and flip flop 430<n>. Each stage is configured to receive its corresponding stage input, and determine whether a pulse width of its stage input is at least a unit delay. In response to the stage input having at least the unit delay, the stage<n> may generate a unit pulse detection signal ST_pre<n> having a pulse width subtracted from the pulse width of the stage input by the unit delay. Additionally, in response to a pulse width of the stage input having the at least the unit delay, the stage <n> may change a state of the bit SEL<n>, for example, from LOW state to HIGH state and maintain the changed state until a next edge (e.g., a rising edge) of the reset signal. The first stage<1> may receive the difference signal 225 as its stage input and generate a unit pulse detection signal ST_pre<1> and the bit SEL<1>. Each subsequent stage<n> may receive the unit pulse detection signal ST_pre<n−1> from its preceding stage as its stage input and generate a unit pulse detection signal ST_pre<n> and the bit SEL<n> according to the unit pulse detection signal ST_pre<n−1>. Hence, pulse widths of the unit pulse detection signals ST_pre<n:1> may be progressively decreased from the pulse width of the difference signal 225.

In this configuration, highest digit of the bits SEL<3:0> having HIGH state or value '1' may indicate the pulse width of the difference signal 225 in a digital notation. Assuming for an example that a unit delay is 2 ns, the unit pulse detection signal ST_pre<1> indicates that the difference signal 225 has a pulse width of at least 2 ns; the unit pulse detection signal ST_pre<2> indicates that the difference signal 225 has a pulse width of at least 4 ns; and the unit pulse detection signal ST_pre<3> indicates that the difference signal 225 has a pulse width of at least 6 ns. In case the difference signal 225 has a pulse width of 5 ns in the above example, the delay control signal 235 can be represented as '0111' SEL<3:0>.

In one aspect, each stage <n> includes a corresponding AND gate 410<n>, unit delay circuit 420<n>, and flip flop 430<n> operating together to receive a stage input, and generate a unit pulse detection signal ST_pre<n> and a bit SEL<n> according to the stage input. The AND gate 410<n> may include a first input and a second input, where the first input of the AND gate 410<n> is coupled to an input of a corresponding unit delay circuit 420<n> and the second input of the AND gate 410<n> is coupled to an output of the corresponding unit delay circuit 420<n>. The first input may be coupled to the stage input of the stage<n>. In this configuration, the AND gate 410<n> generates a unit pulse detection signal ST_pre<n> having a pulse width subtracted from a pulse width of its stage input by a unit delay (e.g., 2 ns) of the unit delay circuit 420<n>. The flip flop 430<n> may be a DQ flip flop including a D input port coupled to a supply terminal VDD, a clock input port coupled to an output of the AND gate 410<n> to receive the unit pulse detection signal ST_pre<n>, a reset port that may be coupled to an output of the external control circuit 110 to receive the reset signal, and a Q output port coupled to the adjustable delay circuit 240 to output a digital bit SEL<n> of the delay control signal 235. Detailed example operations of components of the delay control circuit 230 are provided below with respect to FIG. 5.

Figure 5:
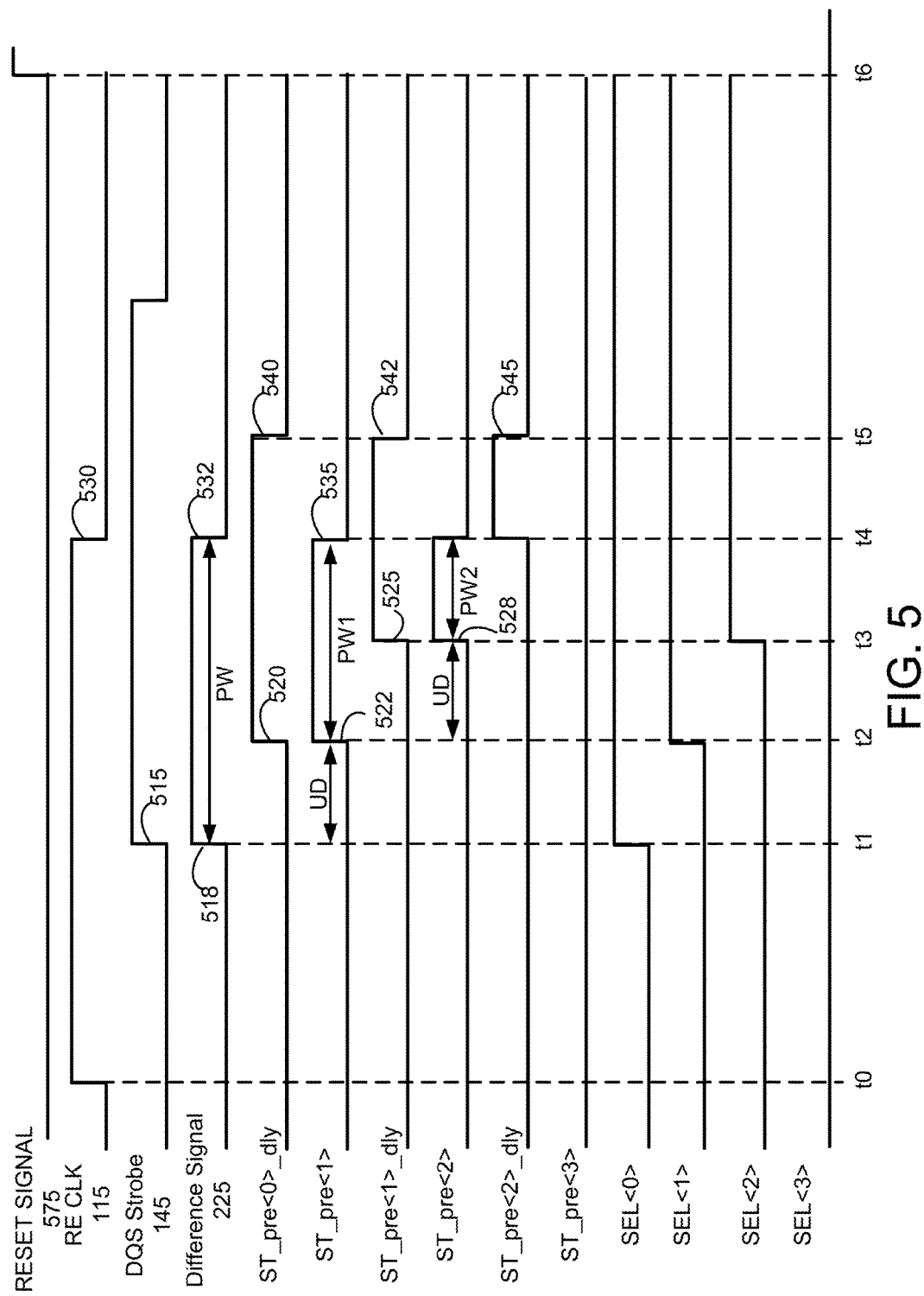
FIG. 5 is a timing diagram of signals of the delay control circuit of FIG. 4 in operation in accordance with an illustrative embodiment.

Referring to FIG. 5, illustrated is a timing diagram of signals of the delay control circuit 230 of FIG. 4 in operation, in accordance with an illustrative embodiment. Specifically, FIG. 5 shows example timing diagrams of the RE CLK 115, DQS strobe 145, difference signal 225, unit pulse detection signals ST_pre<3:1>, unit pulse detection delayed signals ST_pre<2:0>_dly, and bits SEL <3:0>.

At time t0, the delay control circuit 230 may receive a reset signal, and may reset the bits SEL<3:0> to LOW states and reset the unit pulse detection signals ST_pre<3:0> and unit pulse detection delayed signals ST_pre<2:0>_dly to LOW states, in response to the reset signal.

At time t1, the difference signal generator 220 may receive a rising edge 515 of a pulse of the DQS strobe 145, and may generate the difference signal 225 to have HIGH state, in response to the rising edge 515. The flip flop 430<0> may generate the bit SEL<0> to have HIGH state, in response to the rising edge 518 of the difference signal 225.

The unit delay circuit 420<1> receives the difference signal 225 and delays the difference signal 225 by a unit delay UD to obtain the unit pulse detection delayed signal ST_pre<O>_dly. Hence, the unit pulse detection delayed signal ST_pre<O>_dly has a rising edge 520 at time t2. At time t2, the AND gate 410<1> generates the unit pulse detection signal ST_pre<1> to have HIGH state, because the pulse width PW of the difference signal 225 is larger than the unit delay UD of the unit delay circuit 420<1>. The flip flop 430<1> may generate the bit SEL<1> to have HIGH state, in response to the rising edge 522 of the unit pulse detection signal ST_pre<1>.

Similarly, the unit delay circuit 420<2> receives the unit pulse detection signal ST_pre<1> and delays the unit pulse detection signal ST_pre<1> by the unit delay UD to obtain the unit pulse detection delayed signal ST_pre<1>_dly. Hence, the unit pulse detection delayed signal ST_pre<1>_dly has a rising edge 525 at time t3. At time t3, the AND gate 410<2> generates the unit pulse detection signal ST_pre<2> to have HIGH state, because the pulse width PW1 of the unit pulse detection signal ST_pre<1> is larger than the unit delay UD of the unit delay circuit 420<2>. The flip flop 430<2> may generate the bit SEL<2> to have HIGH state, in response to the rising edge 528 of the unit pulse detection signal ST_pre<2>.

At time t4, the difference signal generator 220 may receive a falling edge 530 of the RE CLK 115 (or a rising edge of the inverted RE CLK), and may generate the difference signal 225 to have LOW state. Thus, the difference signal 225 can have the pulse width PW corresponding to a time difference between the rising edge 518 of the DQS strobe 145 and a following rising edge of the inverted RE CLK (or the following falling edge 530 of the RE CLK 115). In response to the falling edge 532 of the difference signal 225, the AND gate 410<1> generates the unit pulse detection signal ST_pre<1> to have LOW state. Thus, the unit pulse detection signal ST_pre<1> has a pulse width PW1 less than the pulse width PW of the difference signal 225 by the unit delay UD. Similarly, in response to the falling edge 535 of the unit pulse detection signal ST_pre<1>, the AND gate 410<2> generates the unit pulse detection signal ST_pre<2> to have LOW state. Therefore, the unit pulse detection signal ST_pre<2> has a pulse width PW2 less than the pulse width PW1 of the unit pulse detection signal ST_pre<1> by the unit delay UD. In response to the unit pulse detection signal ST_pre<3> having LOW state or the unit pulse detection delayed signal ST_pre<2>_dly having LOW state, the AND gate 410<3> generates the unit pulse detection signal ST_pre<3> to have LOW state. In one aspect, because the pulse width PW2 of the unit pulse detection signal ST_pre<2> is not larger than the unit delay UD, the unit pulse detection signal ST_pre<3> maintains LOW state. Also, because there is no rising edge in the unit pulse detection signal ST_pre<3>, the flip flop 430<3> keeps the bit SEL<3> in LOW state.

At time t5, the unit delay circuits 420<3:1> delay the unit pulse detection signal ST_pre<2:1> and the difference signal 225 to generate the unit pulse detection delayed signals ST_pre<2:0>_dly, respectively. Hence, the unit pulse detection delayed signals ST_pre<2:0>_dly have falling edges 545, 542, 540, respectively at time t5 after the unit delay from the time t4.

At time t6, the delay control circuit 230 may receive the reset signal. The reset signal may be provided from the external control circuit 110 or internally generate by the memory device 120. Between time t5 and t6, the flip flops 430<3:0> maintain states of SEL<3:0> indicating whether a rising edge is detected in the unit pulse detection signals ST_pre<3:1> and the difference signal 225, respectively. Thus, the values of the SEL<3:0> may be sampled, between the time t5 and time t6 to configure an amount of delay to be added to the RE CLK 115 to obtain the modified RE CLK 155. According to the modified RE CLK 155, the DQS strobe 145 may be adjusted such that the data access time tDQSRE can be within the data access time tDQSRE range. The flip flops 430<3:0> may reset the states of SEL<3:0> to LOW states or values '0000,' in response to the reset signal.

Figure 6:
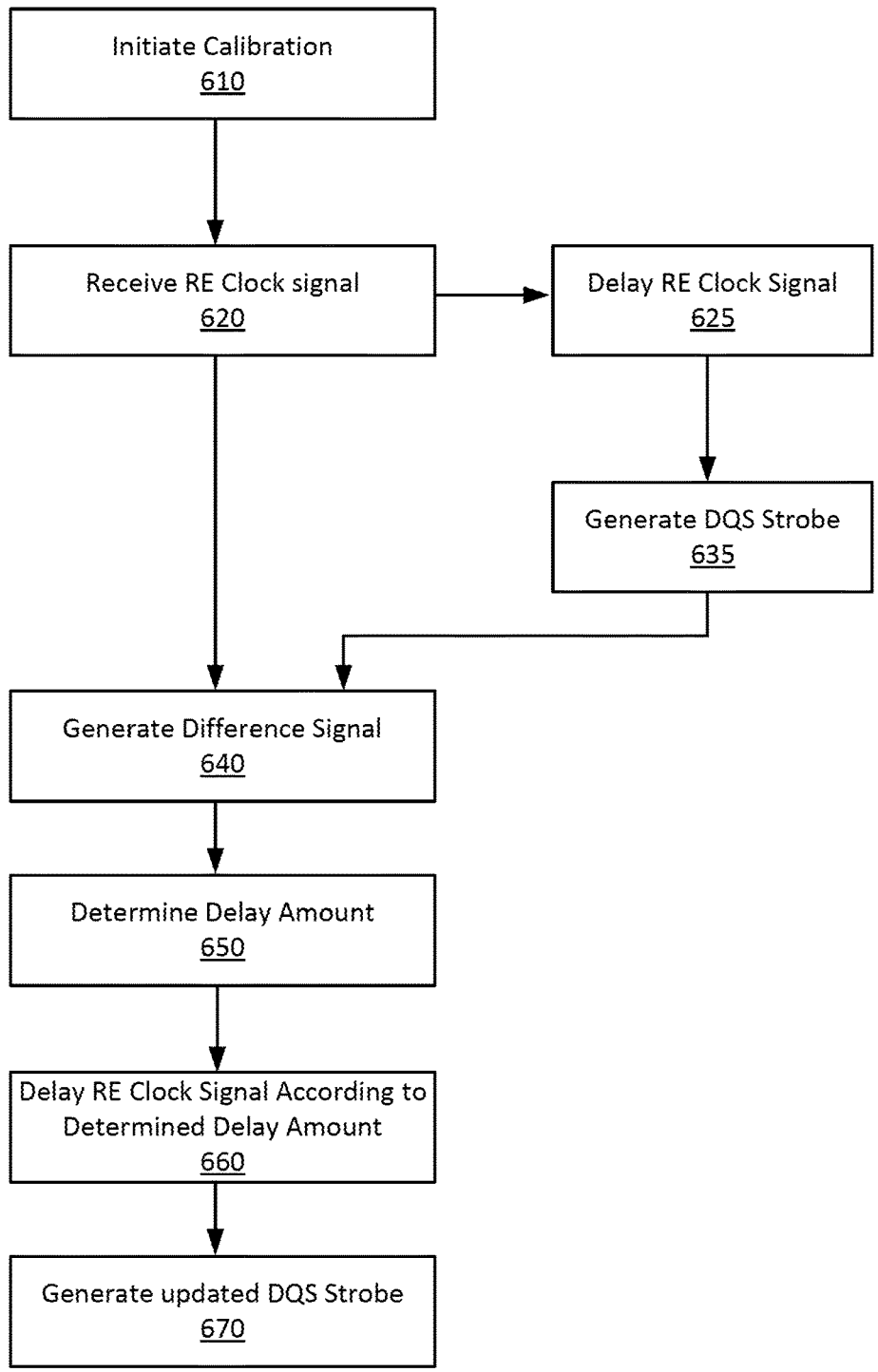
FIG. 6 is a process of performing tDQSRE calibration in accordance with an illustrative embodiment.

Referring to FIG. 6, illustrated is a process 600 of performing data access time tDQSRE calibration, in accordance with an illustrative embodiment. The process 600 may be performed by the memory device 120 of FIG. 1. In some embodiments, the process 600 may be performed by other entities. In some embodiments, the process 600 includes additional, fewer, or different steps than shown in FIG. 6.

The memory device 120 may initiate 610 data access time tDQSRE calibration, and receive RE CLK 115 from the external control circuit 110. In some embodiment, the memory device 120 internally generates the RE CLK 115. In some embodiment, the external control circuit 110 initiates the data access time tDQSRE calibration, and transmits the RE CLK 115 to the memory device 120. The memory device 120 may generate a modified RE CLK signal by delaying the RE clock signal 625. The delay added may be a default amount, determined based on previous calibration performed for the memory device 120, or determined based calibration of another memory device. Based on the modified RE CLK 155, the memory device generates 635 a DQS strobe 145.

The memory device 120 generates 640 a difference signal 225 indicating a time difference between the DQS strobe 145 and the RE CLK 115. For example, the difference signal indicates a time difference between a rising edge of the DQS strobe 145 and a following falling edge of the RE CLK 115. The memory device 120 determines 650 a delay amount according to the difference signal 225. For example, the memory device 120 determines 650 the delay amount according to a pulse width of the difference signal 225.

The memory device 120 delays 660 the RE CLK 115 according to the determined delay amount to obtain an updated modified RE CLK 155. According to the updated modified RE CLK 155, the memory device 120 obtains 670 a modified DQS strobe. The delay added to the RE CLK 115 determined according to the pulse width of the difference signal 225 allows an edge (e.g., a rising edge) of the modified DQS strobe to be within the tDQSRE range away from an edge (e.g., rising edge) of the RE CLK 115. Thus, the memory device 120 can receive the content data 135 and the modified DQS strobe 145 in a timely manner, and may successfully transmit the retrieved content data to the external control circuit 110.

Advantageously, the calibration may be performed in one measurement of time difference between the DQS strobe 145 and the RE CLK 115, thus additional measurement or additional calibration may not be performed.

Although the calibration circuit 150 is described as performing delay calibration for performing memory read operation, the calibration circuit 150 may be implemented for performing delay calibration for different operations or different circuit components. In other embodiments, the calibration circuit 150 or other components described herein may be implemented as Field Programmable Gate Array (FPGA), Application Specific Integrated Circuit (ASIC), a software module, or any combination thereof.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:
1. A circuit comprising:
 a difference signal generator coupled to a strobe signal generator and an external control circuit, the difference signal generator configured to generate a difference signal indicating a time difference between a strobe signal from the strobe signal generator and an external clock signal from the external control circuit, wherein the external clock signal is not based on the difference signal; and
 a delay circuit coupled to the difference signal generator and the external control circuit, the delay circuit configured to generate a modified external clock signal by delaying the external clock signal by a delay, the delay determined based at least in part on the difference signal.

2. The circuit of claim 1, wherein the difference signal generator includes a flip flop comprising:
a clock input port coupled to the strobe signal generator, and
a reset port coupled to the external control circuit, and
wherein the flip flop is configured to generate the difference signal having a pulse width corresponding to the time difference between a rising edge of the strobe signal and a rising edge of an inverted external clock signal having an inverted phase to the external clock signal.

3. The circuit of claim 2, further comprising a delay control circuit coupled between the flip flop and the delay circuit, the delay control circuit configured to:
determine the pulse width of the difference signal, and
generate a delay control signal according to the pulse width,
wherein the delay circuit is configured to obtain the modified external clock signal by delaying the external clock signal according to the delay control signal.

4. The circuit of claim 3, wherein the delay control circuit includes a chain of AND gates and a set of flip flops, each AND gate of the chain of AND gates coupled to a corresponding flip flop of the set of flip flops.

5. The circuit of claim 4, wherein an AND gate of the chain of AND gates includes:
a first input coupled to an output of a preceding AND gate of the chain of AND gates,
a second input coupled to a delayed output of the preceding AND gate delayed by a unit delay amount, and
an output coupled to a clock input of a corresponding flip flop of the set of flip flops and an input of a succeeding AND gate of the chain of AND gates.

6. The circuit of claim 4, wherein an output of the corresponding flip flop of the set of flip flops indicates a bit of a digital representation of the time difference.

7. The circuit of claim 1, wherein the strobe signal is a DQS strobe and the external clock signal is an RE signal.

8. The circuit of claim 1, wherein the strobe signal generator is configured to modify the strobe signal to be synchronous to the modified external clock signal.

9. The circuit of claim 8, wherein a transmission circuit coupled to a memory timing calibration circuit is configured to generate an output signal indicating content data stored by memory cells according to the modified strobe signal.

10. A device comprising:
memory cells configured to store content data;
a strobe signal generator configured to generate a strobe signal;
a memory timing calibration circuit comprising:
a difference signal generator coupled to the strobe signal generator and an external control circuit, the difference signal generator configured to:
receive the strobe signal from the strobe signal generator;
receive an external clock signal from the external control circuit, and
determine a time difference between the strobe signal and the external clock signal, and
a delay circuit coupled to the difference signal generator and the external control circuit, the delay circuit configured to generate a modified external clock signal by delaying the external clock signal based at least in part on the time difference; and
a transmission circuit coupled to the memory timing calibration circuit, wherein the transmission circuit is configured to generate an output signal indicating the content data stored by the memory cells according to the modified external clock signal.

11. The device of claim 10, wherein the difference signal generator includes a flip flop comprising:
a clock input port coupled to the strobe signal generator, and
a reset port coupled to the external control circuit, and
wherein the flip flop is configured to generate the difference signal having a pulse width corresponding to the time difference between a rising edge of the strobe signal and a rising edge of an inverted external clock signal having an inverted phase to the external clock signal.

12. The device of claim 11, wherein the memory timing calibration circuit further comprises a delay control circuit coupled between the flip flop and the delay circuit, the delay control circuit configured to:
determine the pulse width of the difference signal, and
generate a delay control signal according to the pulse width,
wherein the delay circuit is configured to obtain the modified external clock signal by delaying the external clock signal according to the delay control signal.

13. The device of claim 12, wherein the delay control circuit includes a chain of AND gates and a set of flip flops, each AND gate of the chain of AND gates coupled to a corresponding flip flop of the set of flip flops.

14. The device of claim 13, wherein an AND gate of the chain of AND gates includes:
a first input coupled to an output of a preceding AND gate of the chain of AND gates,
a second input coupled to a delayed output of the preceding AND gate delayed by a unit delay amount, and
an output coupled to a clock input of a corresponding flip flop of the set of flip flops and an input of a succeeding AND gate of the chain of AND gates.

15. The device of claim 10, wherein the difference signal generator comprises one of a latch circuit, a pulsed latch circuit, an AND gate, an OR gate, a NAND gate, a NOR gate, a XOR gate, and a XNOR gate.

16. The device of claim 15, further comprising a pulse width controller (i) coupled between the difference signal generator and the external control circuit and (ii) coupled between the delay circuit and the external control circuit, the pulse width controller configured to:
receive the external control signal from the external control circuit;
determine whether a pulse width of the external control circuit is within a predetermined range;
adjust the pulse width of the external control circuit to be within the predetermined range, in response to the determined pulse width being out of a predetermined range; and
bypass adjusting the pulse width of the external control circuit, in response to the determined pulse width being within the predetermined range.

17. A system comprising:
a controller to generate a clock signal;
a first memory device coupled to the controller, the first memory device fabricated on a first die, the first memory device configured to:
generate a first strobe signal,
generate a first difference signal indicating a first time difference between the first strobe signal and the clock signal, generate a first modified clock signal by delaying the clock signal by a first delay, the first delay determined based at least in part on the first difference signal, and transmit data stored by the first memory device according to the first modified clock signal; and a second memory device coupled to the controller, the second memory device fabricated on a second die, the second memory device configured to:

generate a second strobe signal, generate a second difference signal indicating a second time difference between the second strobe signal and the clock signal, generate a second modified clock signal by delaying the clock signal by a second delay, the second delay determined based at least in part on the second difference signal, and transmit data stored by the second memory device according to the second modified clock signal.

18. The system of claim 17, wherein the first memory device includes:

a flip flop configured to generate the first difference signal having a pulse width corresponding to the first time difference between a rising edge of the first strobe signal and a rising edge of an inverted clock signal having an inverted phase to the clock signal.

19. The system of claim 18, wherein the first memory device further includes:

a delay control circuit coupled to the flip flop, the delay control circuit configured to:

determine the pulse width of the first difference signal, and generate a delay control signal according to the pulse width, and a delay circuit coupled to the delay control circuit and the controller, the delay control circuit configured to:

obtain the first modified clock signal by delaying the clock signal according to the delay control signal.

20. The system of claim 17, wherein the first die and the second die are different dies.

21. The system of claim 17, wherein the second delay is different from the first delay, and wherein the data transmitted by the first memory device and the data transmitted by the second memory device are synchronized with the clock signal.

22. A device comprising:

means for receiving an external clock signal from an external control circuit;

means for determining a time difference between the external clock signal and a strobe signal;

means for obtaining a modified external clock signal by delaying the external clock signal by a delay determined based at least in part on the time difference; and means for generating a modified strobe signal according to the modified external clock signal.

* * * * *